(12) United States Patent
Rivoirard (10) Patent No.: US 9,306,505 B2
(45) Date of Patent: Apr. 5, 2016

(54) LOW-NOISE AMPLIFIER CIRCUIT (71) Applicant: ST-Ericsson SA, Plan-les-Ouates (CH)

(72) Inventor: Frederic Rivoirard, Fontaine (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 38 days.

(21) Appl. No.: 14/343,894

(22) PCT Filed: Oct. 8, 2012

(86) PCT No.: PCT/EP2012/069821
§ 371 (c)(1),
(2) Date: Mar. 10, 2014

(87) PCT Pub. No.: WO2013/053661
PCT Pub. Date: Apr. 18, 2013

(65) Prior Publication Data
US 2014/0375386 A1    Dec. 25, 2014

Related U.S. Application Data (60) Provisional application No. 61/554,176, filed on Nov. 1, 2011.

(30) Foreign Application Priority Data

Oct. 13, 2011 (EP) .................................. 11306330

(51) Int. Cl.
*H03F 3/04* (2006.01)
*H03F 1/32* (2006.01)
(Continued)

(52) U.S. Cl.
CPC ............... *H03F 1/3205* (2013.01); *H03F 1/26* (2013.01); *H03F 1/3211* (2013.01); *H03F 1/56* (2013.01); *H03F 3/193* (2013.01); *H03F 3/195* (2013.01); *H03F 3/211* (2013.01); *H03F 3/45179* (2013.01); *H03F 3/45273* (2013.01); *H03F 2200/06* (2013.01); *H03F 2200/09* (2013.01); *H03F 2200/294* (2013.01); *H03F 2200/451* (2013.01); *H03F 2203/45091* (2013.01);
(Continued)

(58) Field of Classification Search
USPC .................................. 330/301, 253, 277, 302
IPC .................................................. H03F 3/04,3/45
See application file for complete search history.

(56) References Cited

U.S. PATENT DOCUMENTS 7,902,627 B2 * 3/2011 Dong et al. .................... 257/499
8,294,515 B1 * 10/2012 Riekki et al. .................... 330/51
(Continued)

OTHER PUBLICATIONS

International Search Report issued in corresponding International application No. PCT/EP2012/069821, date of mailing Dec. 20, 2012.
Written Opinion of the International Searching Authority issued in corresponding International application No. PCT/EP2012/069821, date of mailing Dec. 20, 2012.
(Continued)

*Primary Examiner* — Patricia T Nguyen
(74) *Attorney, Agent, or Firm* — Patent Portfolio Builders PLLC (57) ABSTRACT

A low-noise amplifier (LNA) circuit utilizes the capacitive cross coupling technique with two pairs of NMOS transistors in conjunction with two cross coupled PMOS transistors to obtain a reduced noise figure. By using the cross coupling technique on the PMOS input transistor, the LNA circuit is able to reduce the noise figure below 2 dB without the use of an inductor. This LNA circuit may be used to amplify a signal in the WLAN band or the Bluetooth band, either independently or simultaneously.

14 Claims, 3 Drawing Sheets

(51) Int. Cl.
  *H03F 1/26* (2006.01)
  *H03F 1/56* (2006.01)
  *H03F 3/195* (2006.01)
  *H03F 3/45* (2006.01)
  *H03F 3/193* (2006.01)
  *H03F 3/21* (2006.01)

(52) U.S. Cl.
  CPC .......... *H03F2203/45306* (2013.01); *H03F 2203/45311* (2013.01); *H03F 2203/45312* (2013.01); *H03F 2203/45334* (2013.01); *H03F 2203/45512* (2013.01); *H03F 2203/45544* (2013.01); *H03F 2203/45562* (2013.01); *H03F 2203/45576* (2013.01)

(56) References Cited

U.S. PATENT DOCUMENTS

| | | | |
|---|---|---|---|
| 8,692,582 B1* | 4/2014 | Atesoglu et al. | 327/65 |
| 2006/0057990 A1* | 3/2006 | Behzad et al. | 455/234.1 |
| 2007/0146071 A1 | 6/2007 | Wu | |
| 2007/0176703 A1* | 8/2007 | Li et al. | 331/167 |
| 2007/0216481 A1* | 9/2007 | Jimenez et al. | 330/253 |
| 2010/0237942 A1 | 9/2010 | Li et al. | |
| 2012/0087418 A1* | 4/2012 | Zheng et al. | 375/259 |

OTHER PUBLICATIONS

Hwang, Yuh-Shyan, et al., "An inductorless wideband noise-cancelling CMOS low noise amplifier with variable-gain technique for DTV tuner application," AEU International Journal of Electronics and Communications, Elsevier, Jena, Germany, vol. 64, No. 11, Nov. 1, 2010, pp. 1009-1014, XP027326738, ISSN: 1434-8411.

Chimpleekul, Puttachai, et al., "A High-Gain Fully-Differential Thermal Noise-Cancelling CMOS Front-End Amplifier," Microelectronics and Electronics (Primeasia), IEEE 2011 Asia Pacific Conference on Postgraduate Research, Oct. 6, 2011, pp. 90-93, XP031990774, DOI: 10.1109/PRIMEASIA.2011.6075078, ISBN: 978-1-4577-1608-9.

Blaakmeer, Stephan C., et al., "Wideband Balun-LNA with Simultaneous Output Balancing, Noise-Canceling and Distortion-Canceling," IEEE Journal of Solid-State Circuits, IEEE Service Center, Piscataway, NJ, USA, vol. 43, No. 6, Jun. 1, 2008, pp. 1341-1350, XP011215762, ISSN: 0018-9200.

Wei Zhuo, et al.; "Using Capacitive Cross-Coupling Technique in RF Low Noise Amplifiers and Down-Conversion Mixer Design"; Proceedings of the 26th European Solid State Circuits Conference, 2000, ESSCIRC '00; Sep. 19-21, 2000; pp. 77-80; Stockholm, Sweden.

Wei-Hung Chen, et al.; "A Highly Linear Broadband CMOS LNA Employing Noise and Distortion Cancellation"; IEEE Journal of Solid-State Circuits, vol. 43, No. 5; May 2008; pp. 1164-1176.

Jonathan Borremans, et al.; "3.6 A 40nm CMOS Highly Linear .4-to-6GHz Receiver Resilient to 0dBm Out-of-Band Blockers"; ISSCC 2011, Session 3, RF Techniques, 3.6; 2011 IEEE International Solid-State Circuits Conference; pp. 62-6-64.

* cited by examiner

Fig.1

Fig.1 bis

LOW-NOISE AMPLIFIER CIRCUIT

FIELD OF THE INVENTION

The invention relates to a low-noise amplifier circuit. A circuit and a mobile comprising such low-noise amplifier circuit are also proposed. A use for amplifying signals and a method for reducing the noise of a low-noise amplifier circuit are further considered.

BACKGROUND OF THE INVENTION

A low-noise amplifier circuit is an electronic amplifier used to amplify very weak signals. Weak signals may, for instance, be captured by a detection device such as an antenna. The low-noise amplifier circuit is often named after its acronym LNA circuit. For instance, LNA may be used for a WLAN band which extends from 2.41 GHZ to 2.48 GHz.

The low-noise amplifier circuit is usually located very close to the detection device to reduce losses in the feed line. Using a LNA circuit, the effect of noise from subsequent stages of the receive chain is reduced by the gain of the LNA circuit, while the noise of the LNA circuit itself is injected directly into the received signal. Thus, it is preferred when using a LNA circuit that the desired signal power be boosted while adding as little noise and distortion as possible, so that the retrieval of this signal is possible in the later stages in the system.

A good LNA circuit has a low noise figure. Noise figure is often named after its acronym NF. NF is a measure of degradation of the signal-to-noise ratio SNR, caused by components in a radio frequency RF signal chain. The noise figure is defined as the ratio of the output noise power of a device to the portion thereof attributable to thermal noise in the input termination at standard noise temperature $T_0$, usually 290 K. The noise figure is thus the ratio of actual output noise to that which would remain if the device itself did not introduce noise. It is a number by which the performance of a radio receiver can be specified.

A good LNA circuit further exhibits a large enough gain (20 dB may be considered as a large gain) and should have large enough intermodulation and compression point. In telecommunications, a third-order intercept point IIP3 or TOI is a measure for weakly nonlinear systems and devices, for example receivers, linear amplifiers and mixers. It is based on the idea that the device nonlinearity can be modeled using a low-order polynomial, derived by means of Taylor series expansion. The third-order intercept point relates nonlinear products caused by the third-order nonlinear term to the linearly amplified signal, in contrast to the second-order intercept point that uses second order terms.

Further criteria are operating bandwidth, gain flatness, stability and input and output voltage standing wave ratio (VSWR).

In addition, package PIN reduction imposes to share the LNA circuit input with other blocks like power amplifier also named after its acronym PA. Thus, low input impedance for the LNA circuit is preferred. In accordance, low consumption and low area are also some key important points for the LNA circuit. The common gate LNA circuit is a right way to provide low input impedance. However, such arrangement exhibits a high NF compared to the common source LNA circuit. In other words, common gate LNA circuits are usually too noisy.

It is known from the article "Using Capacitive Cross Coupling Technique in RF Low noise Amplifiers and Down Conversion Mixer Design" by Wei Zhuo et al. an implementation of the cross coupling technique on a differential NMOS LNA circuit. The LNA circuit exhibits a NF value of 3 dB, a gain of 12 dB and a linearity IIP3 of 6.7 dBm under 2.7 V voltage supply.

SUMMARY OF THE INVENTION

The object of the present invention is to alleviate at least partly the above mentioned drawbacks.

More particularly, the invention aims to provide a low-noise amplifier circuit with reduced noise. Indeed, it will be shown that reduced NF of the common gate LNA circuit below 2 dB, notably for transistor belonging to the class of CMOS 40 nm, can be obtained notably by using cross coupling technique on the PMOS input transistor and without using any inductor.

This object is achieved with a low-noise amplifier circuit comprising a first transistor NMOS and a second transistor NMOS, each transistor having a source terminal, a gate terminal and a drain terminal; and a third transistor NMOS and a fourth transistor NMOS, each transistor having a source terminal, a gate terminal and a drain terminal; wherein: the source of the second transistor is coupled to the drain terminal of the first transistor, and the source of the third transistor is coupled to the drain terminal of the fourth transistor; and the gate terminal of the first transistor has a first capacitive coupling to the source terminal of the fourth transistor and the gate terminal of the fourth transistor has a second capacitive coupling to the source terminal of the first transistor; characterised in that the low-noise amplifier circuit further comprises a fifth transistor PMOS and a sixth transistor PMOS, each transistor having a source terminal, a gate terminal and a drain terminal wherein: the drain of the fifth transistor is coupled to the drain terminal of the second transistor, and the drain of the sixth transistor is coupled to the drain terminal of the third transistor; the source terminal of the fifth transistor has a third capacitive coupling to the source terminal of the first transistor; the gate terminal of the fifth transistor has a fourth capacitive coupling to at least the source terminal of the sixth transistor or the source terminal of the fourth transistor; the gate terminal of the sixth transistor has a fifth capacitive coupling to at least the source terminal of the fifth transistor or the source terminal of the first transistor; and the source terminal of the sixth transistor has a sixth capacitive coupling to the source terminal of the fourth transistor.

Preferred embodiments comprise one or more of the following features:

- the low-noise amplifier circuit has inputs and outputs, the source terminals of the first transistor and the fourth transistor being the inputs of the low-noise amplifier circuit and the drain terminals of the second transistor and the third transistor being the outputs of the low-noise amplifier circuit.
- the first capacitive coupling increases an effective transconductance of the first transistor and decreases an effective equivalent input resistance of the first transistor both by a factor superior or equal to two, and/or wherein the second capacitive coupling increases an effective transconductance of the fourth transistor and decreases an effective equivalent input resistance of the fourth transistor both by a factor superior or equal to two, and/or wherein the fourth capacitive coupling increases an effective transconductance of the fifth transistor and decreases an input resistance of the fifth transistor both by a factor superior or equal to two, and/or wherein the fifth capacitive coupling increases an effective transconductance of the sixth transistor and decreases an input resistance of the sixth transistor both by a factor superior or equal to two.

input low-noise amplifier circuit has an inductive coupling to the ground, preferably with at least a wired inductance.

gate potential of the fifth and sixth transistors is fixed by a common loop circuit via two resistances, and wherein the reference voltage of the common loop is taken between outputs of the low noise amplifier circuit.

at least one of the source terminal of the fifth or sixth transistors has a resistive coupling to a DC-Voltage, preferably with at least a wired resistor, and wherein gate potential of the first and fourth transistors is fixed by a current mirror via two resistances.

at least one of the gate terminal of the first or fourth transistors either has a resistive coupling to a DC-Voltage, preferably with at least a wired resistor, or has a coupling to a DC-Voltage through a MOS transistor.

the low-noise amplifier circuit is adapted to amplify at least one signal in the WLAN band or at least one signal in the Bluetooth band.

the noise figure values over the WLAN band and/or Bluetooth band of the low-noise amplifier circuit are inferior to 2 dB, preferably inferior to 1.8 dB.

a circuit comprising a low-noise amplifier circuit according to some embodiments of the invention, a power amplifier, wherein the low-noise amplifier circuit input is shared with the power amplifier across a Balun.

A mobile device comprising a low-noise amplifier circuit according to some embodiments of the invention.

Further features and advantages of the invention will appear from the following description of embodiments of the invention, given as non-limiting examples, with reference to the accompanying drawings listed hereunder.

BRIEF DESCRIPTION OF THE DRAWINGS

FIG. 1bis is a schematic view of another example of LNA circuit,

DETAILED DESCRIPTION OF THE INVENTION

Figure 1:
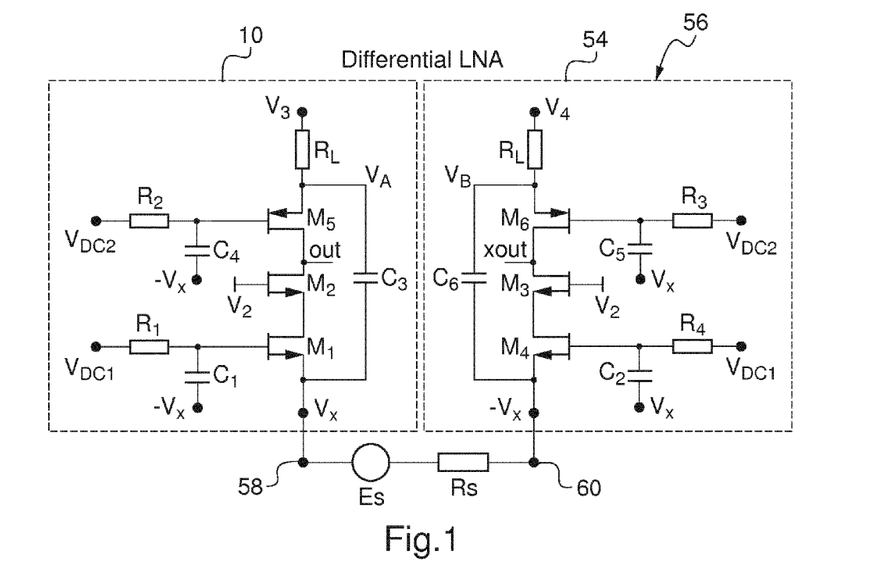
FIG. 1 is a schematic view of an example of LNA circuit.

The present invention is related to a low-noise amplifier circuit. FIG. 1 illustrates a schematic view of an example of a LNA circuit 56. Such low-noise amplifier circuit 56 comprises a first transistor $M_1$ NMOS, a second transistor $M_2$ NMOS, a third transistor $M_3$ NMOS and a fourth transistor $M_4$ NMOS arranged in "a common gate configuration". The LNA circuit 56 further comprises a fifth transistor $M_5$ PMOS and a sixth transistor $M_6$ PMOS arranged with the four previous transistors in a "double common gate configuration".

The metal-oxide-semiconductor field-effect transistor (MOSFET, MOS-FET, or MOS FET) is a transistor used for amplifying or switching electronic signals. The basic principle of this kind of transistor was first proposed by Julius Edgar Lilienfeld in 1925. In MOSFETs, a voltage on the oxide-insulated gate electrode can induce a conducting channel between the two other contacts called source and drain. The channel can be of n-type or p-type, and is accordingly called an nMOSFET or a pMOSFET (also commonly NMOS, PMOS). It is by far the most common transistor in both digital and analog circuits, though the bipolar junction transistor was at one time much more common.

In the case of LNA circuits, JFETs and HEMTs are often used because a high amplification in the first stage of the amplifier is required. The junction gate field-effect transistor JFET or JUGFET is the simplest type of field effect transistor. High electron mobility transistor HEMT, also known as heterostructure FET HFET or modulation-doped FET MODFET, is a field effect transistor incorporating a junction between two materials with different band gaps (i.e., a heterojunction) as the channel instead of a doped region, as is generally the case for MOSFET.

The two types of transistors NMOS and PMOS are slightly different, however both comprise three terminals labelled gate, source, and drain. In the case of FET, a voltage at the gate can control a current between source and drain.

In the LNA circuit 56 of the FIG. 1 transistors are connected together in order to obtain the low-noise amplification desired. Thus, the source of the second transistor $M_2$ is coupled to the drain terminal of the first transistor $M_1$, and the source of the third transistor $M_3$ is coupled to the drain terminal of the fourth transistor $M_4$. Besides the gate terminal of the first transistor $M_1$ has a first capacitive coupling $C_1$ to the source terminal of the fourth transistor $M_4$ and the gate terminal of the fourth transistor $M_4$ has a second capacitive coupling $C_2$ to the source terminal of the first transistor $M_1$. Both capacitive couplings $C_1$ and $C_2$ provide means for reducing noise in the LAN circuit 56.

Moreover, the two additional transistors PMOS $M_5$ and $M_6$ further improve this reduction effect. Thus, the drain of the fifth transistor $M_5$ is coupled to the drain terminal of the second transistor $M_2$, and the drain of the sixth transistor $M_6$ is coupled to the drain terminal of the third transistor $M_3$.

For coupling each side circuit 10 and 54 of the LNA circuit 56 together, transistors are also cross-coupled between them. Thus, the source terminal of the fifth transistor $M_5$ has a third capacitive coupling $C_3$ to the source terminal of the first transistor $M_1$, the gate terminal of the fifth transistor $M_5$ has a fourth capacitive coupling $C_4$ to at least the source terminal of the sixth transistor $M_6$ (as in FIG. 1 bis) or the source terminal of the fourth transistor $M_4$ (as in FIG. 1), the gate terminal of the sixth transistor $M_6$ has a fifth capacitive coupling $C_5$ to at least the source terminal of the fifth transistor $M_5$ (as in FIG. 1 bis, where the potential of source terminal of fifth transistor $M_5$ is labelled $V_A$) or the source terminal of the first transistor $M_1$ (as in FIG. 1) and the source terminal of the sixth transistor $M_6$ has a sixth capacitive coupling $C_6$ to the source terminal of the fourth transistor $M_4$.

The fourth capacitive coupling $C_4$ can in fact either be connected the source terminal of the sixth transistor $M_6$ (as in FIG. 1bis, where the potential of source terminal of sixth transistor $M_6$ is labelled $V_B$) or the source terminal of the fourth transistor $M_4$ (as in FIG. 1), because these both source terminals are also connected by the sixth capacitive coupling $C_6$. Furthermore, with a RF signal a capacitive coupling, which is preferably at least one wired capacitor, can be equivalent to a short cut. Thus in this regime, the source terminal of the sixth transistor $M_6$ and the source terminal of the fourth transistor $M_4$ are similar.

In a preferred embodiment, illustrated on FIG. 1, the fourth capacitive coupling $C_4$ is made between the gate terminal of the fifth transistor $M_5$ and the source terminal of the fourth transistor $M_4$ in terms of phase shift, as well as the fifth capacitive coupling $C_5$ is made between the gate terminal of the sixth transistor $M_6$ and the source terminal of the first transistor $M_1$ for the same reasons.

As the following description will further details these points, the capacitive couplings $C_3$ and $C_6$ provide an equivalent input resistance for each side circuit 10 and 54 of the LNA circuit 56. Besides, the capacitive couplings $C_4$ and $C_5$ allow in a similar way than the capacitive couplings $C_1$ and $C_2$ to provide means for reducing noise in the LAN circuit 56.

Figure 2:
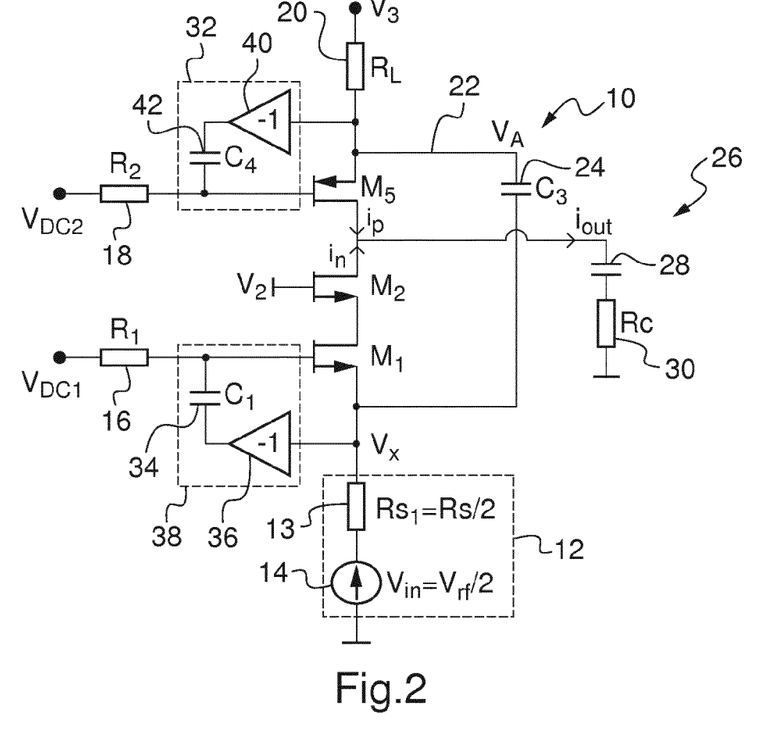
FIG. 2 shows a schematic view of a mathematically equivalent of a single side circuit of an example of LNA circuit according to FIG. 1.

In order to detail the process of noise reduction for in the LNA circuit 56, explanations will be focused based on one side circuit 10 of the LNA circuit 56. For this purpose, FIG. 2 describes one side circuit 10 of the LNA circuit of FIG. 1. FIG. 2 is an equivalent circuit in order to better explain the invention, but the actual electronic circuit remains the circuit of FIG. 1 or FIG. 1bis.

The capacitive coupling $C_1$ and $C_4$ coming from the side circuit 10 to the side circuit 54 are replaced by mathematically equivalent circuits 32 and 38.

In FIG. 2, the three transistors $M_1$, $M_2$ and $M_5$ are arranged in the so-called "double common gate configuration". This should be understood as the fact that the RF signal $V_{in}$ of the circuit 56 is connected to the source terminal of the first transistor $M_1$ and the source terminal of the fifth transistor $M_5$ via a capacitor 24. The gate terminal of transistors $M_1$, $M_2$ and $M_5$ are at a different DC voltage level.

The transistors are arranged in serial such that a middle transistor may be defined. In the side circuit 10, the first transistor $M_1$ and the fifth transistor $M_5$ are arranged on each side of the middle transistor which is the second transistor $M_2$.

The side circuit 10 further comprises a first circuit 12 at the source terminal of the first transistor $M_1$, which with the third capacitive coupling $C_3$ to the source terminal of the fifth transistor $M_5$, provides an equivalent input resistance $R_{in} = R_L // Zin_n // Zin_p$.

According to the example of FIG. 2, such first circuit 12 comprises a resistor 13 and a voltage source 14. The value of the resistance of resistor 13 is $R_{s1}$ which is equal to $R_S$ over 2. The RF voltage source 14 provides a tension equal to $V_{in} = V_{RF}/2$.

Furthermore, the source terminal of the first transistor $M_1$ is connected to an end of the resistor 13. The other end of the resistor 13 is connected to the RF voltage source 14. The potential of the source terminal of the first transistor $M_1$ is labelled $V_X$.

The gate terminal of the first transistor $M_1$ is connected to an end of a resistor 16. The value of the resistance of resistor 16 is $R_1$. The other end of the resistor 16 is connected to a potential labelled $V_{DC1}$. Such potential may be provided by a voltage source which is not represented on FIG. 2. Instead of resistor 16, a MOS transistor could be used to bias first transistor $M_1$. But using a resistor is better, because it minimizes parasitic capacitor and it improves matching.

The drain terminal of the first transistor $M_1$ is connected to the source terminal of the second transistor $M_2$ as a cascode. The gate of the second transistor $M_2$ is connected to a potential equal to $V_2$. Such potential may be provided by a voltage source which is not represented on FIG. 2.

The gate terminal of the fifth transistor $M_5$ is connected to an end of a resistor 18. The value of the resistance of resistor 18 is $R_2$. The other end of the resistor 18 is connected to a potential labelled $V_{DC2}$. Such potential may be provided by a voltage source which is not represented on FIG. 2.

The source terminal of the fifth transistor $M_5$ is connected to an end of a resistor 20 which is at a potential $V_A$. The value of the resistance of resistor 20 is $R_L$. The other end of the resistor 20 is connected to a potential labelled $V_3$. Such potential may be provided by a voltage source which is not represented on FIG. 2. The source terminal of the fifth transistor $M_5$ is also connected to the source terminal of the first transistor $M_1$, the potential $V_X$, via a branch 22 including a capacitor 24.

The drain terminal of the fifth transistor $M_5$ is both connected to the drain terminal of the second transistor $M_2$ and an output branch 26 of the LNA circuit 10. Such branch 26 comprises a capacitor 28 and a resistor 30. The value of the resistance of resistor 30 is $R_C$. The current issued from the drain terminal of the fifth transistor $M_5$ is labelled $i_p$, the current issued from the drain terminal of the second transistor $M_2$ is labelled $i_n$ and the current circulating in the branch 26 is labelled $i_{out}$. According to Kirchhoff's first law applied in this case, it can be written that the sum of the currents $i_n$ and $i_p$ is equal to $i_{out}$.

The input matching is mainly done by sizing and adjusting the bias current of the input transistors $M_1$ and $M_5$ such that $Zin_n * Zin_p / (Zin_n + Zin_p)$ be equal to the input impedance which is the resistance $Rs_1$. For the sake of illustration, the value of $Rs_1$ will be set to $10\Omega$, be it understood that any other value may be considered.

The side circuit 10 also comprises a second circuit 32 for increasing the effective transconductance of the fifth transistor $M_5$ and decreasing the equivalent input resistance $R_p$. This second circuit 32 is mathematically similar to the fourth capacitive coupling $C_4$ in the LNA circuit 56.

In field effect transistors, and MOSFETs in particular, transconductance is the change in the drain/source current divided by the change in the gate/source voltage with a constant drain/source voltage. The transconductance is labelled $gm_x$ with X the number associated to the transistor. Typical values of gm for a small-signal field effect transistor are 1 to 30 millisiemens. In such case, increasing the effective transconductance of the fifth transistor $M_5$ means that the transconductance $gm_5$ of the fifth transistor $M_5$ is higher with the second circuit 32 in the side circuit 10 than without the second circuit 32 in the side circuit 10.

The side circuit 10 further comprises a third circuit 38 for increasing the effective transconductance of the first transistor $M_1$ and for decreasing the effective equivalent input resistance $R_n$. In such case, decreasing the effective equivalent input resistance $R_p$ and $R_n$ means that the equivalent input resistance is lower with the circuits 32 and 38 than without.

Such side circuit 10 allows matching the input under low impedance.

Furthermore, the addition of second and third circuits 32 and 38 which respectively increase the effective transconductance of the first transistor $M_1$ and the fifth transistor $M_5$ and decrease the effective equivalent input resistance $R_P$ and $R_n$ gives significant improvement on NF. To show that increasing the effective transconductance of the fifth transistor $M_5$ and decreasing the effective equivalent input resistance $R_P$ results in a reduced NF, some calculations will be presented in the following. Only the relevant equations are presented here, other equations are given in appendix II.

Noise in a LNA circuit is mainly due to the current thermal noise of the transistors. This section is also only based on side circuit 10 of the LNA circuit 56. Such noise may indeed be expressed as in the following equation relatively to side circuit 10:

$$NF = 10 \log\left(1 + \frac{\overline{i_{out}^2}}{g_m^2 \overline{vsn^2}}\right) \quad \text{(Equation 1)}$$

$$= 10 \log\left(1 + \frac{\overline{i_n^2} + \overline{i_p^2}}{g_m^2 \overline{vsn^2}}\right)$$

Wherein:

$g_m = i_{out}/V_{in}$ is the complete common gate transconductance, vsn is the resistor input thermal noise $\sqrt{4KTR_{s1}}$.

The expressions of both currents $i_p$ and $i_n$ are also known. For the expression of the current $i_p$, Equation 2 is obtained:

$$\overline{i_p^2} = \frac{4KT\gamma_p g_{m_5}}{\left(1 + \frac{R_{s1}}{R_n} + Gm_p R_{s1}\right)^2} \quad \text{(Equation 2)}$$

Wherein:

K is the Boltzmann constant,

T is the temperature of the LNA circuit 10, $\gamma_p$ is the input channel thermal noise, $gm_5$ is the transconductance of the fifth transistor $M_5$, $R_n$ is the input equivalence resistance of the transistor $M_1$, $Gm_p$ is the effective transconductance of the fifth transistor $M_5$, $R_{s1}$ is the value of the resistance of resistor 13 in circuit 12.

It can be noticed from this Equation 2 that when the transconductance $Gm_p$ is increased, the current $i_p$ is reduced. This results in a reduction of the thermal noise due to this current.

For the expression of the current $i_n$, Equation 3 is obtained:

$$\overline{i_n^2} = \frac{4KT\gamma_n gm_1}{\left(1 + \frac{R_{s1}}{R_p} + Gm_n R_{s1}\right)^2} \quad \text{(Equation 3)}$$

Wherein:

$\gamma_n$ is the output channel thermal noise, $g_{m1}$ is the transconductance of the first transistor $M_1$, $R_p$ is the input equivalent resistance of the fifth transistor $M_5$.

$Gm_n$ is the effective transconductance of the first transistor $M_1$.

It can be noticed from this Equation 3 that when the effective input equivalent resistance $R_p$ is decreased, the current $i_n$ is reduced. This results in a reduction of the thermal noise due to this current.

Therefore, it has been shown that increasing the transconductance $Gm_p$ of the fifth transistor $M_5$ and decreasing the input equivalent resistance $R_p$ results in a reduced NF for the side circuit 10.

This results in a side circuit 10 with reduced noise, the reduction being stable independently from the use and the temperature. Compared to other noise cancelling technique, the current cost of such technique is reduced. In addition, the proposed technique does not exhibit huge NF dispersion with process.

The second circuit 32 may increase the effective transconductance $Gm_p$ of the fifth transistor $M_5$ by a factor superior or equal to two. Indeed, in such case, the effect on the noise reduction is more sensitive.

The second circuit 32 may decrease the equivalent input resistance $R_p$ of the fifth transistor $M_5$ by a factor superior or equal to two. Indeed, in such case, the effect on the noise reduction is more sensitive.

Similar configurations, effects and advantages are present on side circuit 54 thanks to capacitive couplings $C_2$, $C_5$ and $C_6$. Besides effects on both side circuits 10 and 54 can be simultaneous and additives.

This enables to avoid the use of common source LNA circuit. Therefore, the advantage of the common gate structure LNA circuit is kept. Notably, the linearity which can be expressed in terms of IIP3 is better.

The low-noise amplifier will thus exhibits noise figure NF values which are inferior to 2 dB, and even preferably 1.8 dB in either the WLAN band or the Bluetooth band. Bluetooth is often named after its acronym which is BT.

This enables to provide a LNA circuit 56 with improved properties, notably in term of linearity, and reduced noise compared to other LNA circuit in the common gate configuration.

Each side circuit 10 and 54 may be without any coil. It should be understood that coil means a component with a significant inductance and not unwanted inductance due to the imperfectness of wires for instance. Indeed, a side circuit 10 without any coil enables to better follow the input signal that is desired to be amplified.

The second and/or third circuits 32 and 38 of the side circuit 10 may only comprise passive elements. As explained above, the passive elements are intended to increase the effective transconductance of the fifth transistor $M_5$ and to decrease the input equivalence resistance $R_p$. This enables to avoid consuming additional power in the second and/or third circuits 32 and 38.

According to the example of FIG. 2, the second circuit 32 of the side circuit 10 comprises a fourth capacitor $C_4$ cross-coupled between the source and the gate terminals of the fifth transistor $M_5$. This enables to increase the effective transconductance of the fifth transistor $M_5$. This configuration aims to create a mathematically equivalent configuration to the fourth capacitive coupling $C_4$ in the LNA circuit 56 of FIG. 1bis.

Preferably, in the second circuit 32, the fourth capacitor $C_4$ is cross-coupled between the source and the gate terminals of the fifth transistor $M_5$ by introducing an amplifier 40 with a gain of −1 in serial with the fourth capacitor $C_4$. This enables to increase in an even better way the effective transconductance of the fifth transistor $M_5$.

Adding a second circuit 32 in cross coupling for the fifth transistor $M_5$ brings a noise cancelling path which is entirely new.

Figure 3:
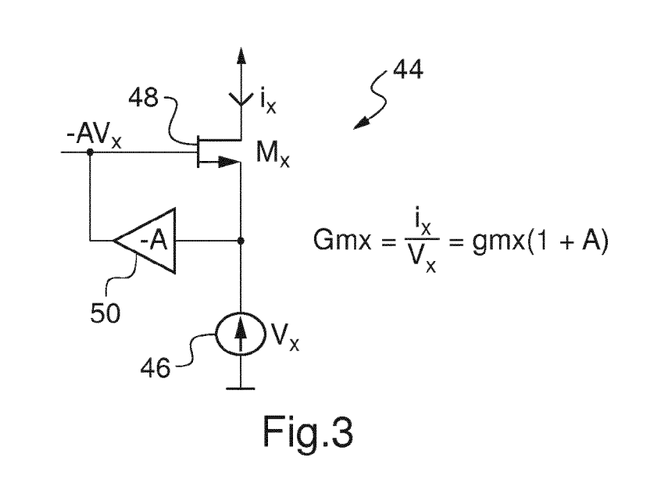
FIG. 3 shows a schematic representation of a transistor $M_X$ with an element equivalent to a cross-coupling configuration.

The way calculation may be led in this case is illustrated by FIG. 3. FIG. 3 is a schematic representation of a transistor with a circuit in equivalent cross coupling configuration.

FIG. 3 is a schematic view of a configuration wherein a transistor 48 labelled $M_X$. FIG. 3 is an equivalent circuit in order to better explain the invention, but the actual electronic circuit remains the circuit of FIG. 1 or FIG. 1bis. The transconductance of the transistor $M_X$ is $gm_x$. It corresponds to the ratio between the current entering the drain terminal and the voltage of the source terminal. The current entering the drain terminal of the transistor $M_X$ is labelled $i_X$ and the source terminal is put at the tension $V_X$ of a voltage source which delivers such tension $V_X$. When this transistor $M_X$ is used in a circuit, as the circuit 44 of FIG. 3, the ratio between the current $i_X$ and the voltage $V_X$ changes. This ratio is then called the effective transconductance of the transistor $M_X$ and labelled $Gm_x$.

In the case of FIG. 3, there is a feedback from the source terminal to the gate terminal of the transistor $M_X$ with an amplifier 50 of gain $-A$. Thus, the gate terminal is controlled by a $-AV_X$ potential.

Therefore, by using, for instance Kirchhoff's laws, it can be obtained:

$$Gm_x = \frac{i_X}{V_X} = g_{mx}(1+A) \quad \text{(Equation 4)}$$

Applied to the case of the second circuit 32, this gives the following equation:

$$Gm_5 = gm_5(1+A) \quad (5)$$

It thus appears that the effective transconductance is increased by a factor $1+A$. If A is equal to 1, this results in an increase of the effective transconductance by a factor 2.

Figure 4:
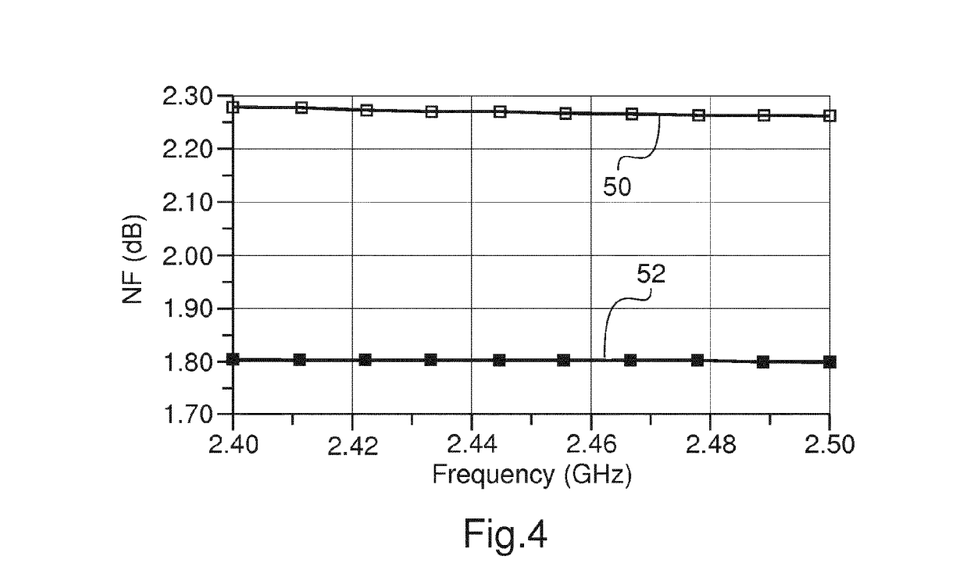
FIG. 4 is a graphic showing the evolution of the NF with frequency for an example of LNA circuit according to FIG. 1.

Such effect is illustrated by the simulation of the graphic of FIG. 4. This graphic shows the evolution of the NF with the frequency, in the range from 2.4 GHz to 2.5 GHz. The curve 50 corresponds to the evolution simulated for the side circuit 10 without the fourth capacitor $C_4$ whereas the curve 52 illustrates the evolution simulated for the side circuit 10 with the fourth capacitor $C_4$. In the case without the fourth capacitor $C_4$, it can be noticed that NF is superior to 2.25 dB at each frequency. For comparison, it can be noticed that NF is inferior to 1.85 dB at each frequency for the case of curve 52. The presence of the fourth capacitor $C_4$ therefore enables to reduce the noise of the side circuit 10.

According to the example of FIG. 2, the third circuit 38 of the low-noise side circuit 10 comprises a first capacitor $C_1$ cross-coupled between the source and the gate terminals of the first transistor $M_1$. This enables to obtain a reduction of effective equivalent input resistance $R_n$. This configuration aims to create a mathematically equivalent configuration to the first capacitive coupling $C_1$ in the LNA circuit 56 of FIG. 1.

Preferably, in the third circuit 38, the first capacitor $C_1$ is cross-coupled between the source and the gate terminals of the first transistor $M_1$ by introducing an amplifier 36 with a gain of $-1$ in serial with the first capacitor $C_1$. This enables to obtain an even better reduction of effective equivalent input resistance $R_n$.

Cross-coupling $C_1$ brings another noise cancelling path, increases the transconductance $gm_1$ by a factor 2 and allows to reduce power consumption of the side circuit 10. The noise factor of the NMOS input stage can be written has:

$$F = 1 + \frac{1}{gm_1(1+A)^2 Rs_1} \cdot \left( \frac{\gamma}{\alpha} + \frac{(1+gm_1 Rs_1)^2}{\frac{gm_1}{gm_2}} \right) \quad \text{(Equation 6)}$$

Wherein:
A represents the gain of the auxiliary cross-coupling amplifier,
$\gamma$ is the channel thermal noise,
$\alpha$ is defined as the ratio between $gm_1$ to $g_{d0}$, $g_{d0}$ being the transconductance when the difference of voltage between the drain and the source terminal $V_{DS1}$ is equal to 0; thus it can be written $\alpha = (gm_1/g_{d0})$.
$g_{m1}$ is the transconductance of the first transistor $M_1$.
$g_{m2}$ is the transconductance of the second transistor $M_2$.

In case, $A=1$ and $1/(gm_1(1+A))=Rs_1$, then the improvement of the factor noise is given by:

$$F = 1 + \frac{1}{2} \cdot \left( \frac{\gamma}{\alpha} + \frac{4gm_2}{gm_1} \right) \quad \text{(Equation 7)}$$

Thus, this results in a reduction of the noise of the side circuit 10.

To sum up, the combination of the first and the fourth capacitors $C_1$ and $C_4$ enables to obtain a side circuit 10 which exhibits a low NF and low consumption compared to existing common gate LNA circuit solutions. Indeed, it only consumes 5 mA differential under 1.2 V and presents a linearity IIP3 of 10 dBm with a NF of 1.8 dB.

Many other elements may be considered for obtaining the same effect. The choice of the elements may be done thanks to a method for reducing the noise of a low-noise amplifier side circuit 10.

Such method, for a given low noise amplifier side circuit 10 comprises the step of choosing the elements of the second circuit 32 for increasing the effective transconductance of the fifth transistor $M_5$. This step of choosing encompasses both the notion of choosing which kind of elements should be considered and choosing their specific properties. The properties to be chosen for a capacitor are for instance its capacitance, its internal resistance and its breakdown voltage. Among the different properties of an element, it should be distinguished between the properties which have an impact on the effective transconductance of the fifth transistor $M_5$ and the properties which have nearly no impact on these parameters. In the case of a capacitor, its capacitance, its internal resistance may modify the effective transconductance of the fifth transistor $M_5$ whereas the breakdown voltage does not have impact on the effective transconductance of the fifth transistor $M_5$. Thus, it should be understood that the choosing step may comprise an optimizing step of the properties of the elements. This optimizing step may be carried out by using a merit function which is minimized for a maximum effective transconductance of the fifth transistor $M_5$.

The method also comprises a step of choosing the elements of the third circuit 38 for decreasing the effective equivalent input resistance $R_n$.

Similar remarks made concerning the step of choosing the elements of the second circuit 32 apply there for this step.

Such method enables to obtain the side circuit 10 as previously described. This method is thus a way to obtain a side circuit 10 with reduced noise, the reduction being stable independently from the use and the temperature.

Further, such method may be performed based on a computer program comprising instructions for performing the method. The program is executable on a programmable device. The application program may be implemented on a high-level procedural or object-oriented programming language, or in assembly or machine language if desired. In any case, the language may be compiled or interpreted language. The program may be a full installation program, or an update program. In the latter case, the program is an update program that updates a programmable device, previously programmed performing parts of the method, to a state wherein the device is suitable for performing the whole method.

The program may be recorded on a data storage medium. The data storage medium may be any memory adapted for recording computer instructions. The data storage medium may thus be any form of nonvolatile memory, including by way of example semiconductor memory devices, such as EPROM, EEPROM, and flash memory devices; magnetic disks such as internal hard disks and removable disks; magneto-optical disks; and CD-ROM disks.

This method can be used in a similar way on side circuit 54 of the LNA circuit 56. The use of the above mentioned method on both sides provide a method for reducing the noise on the whole LNA circuit 56.

Some other elements can be present on the LNA circuit 56 as an inductive coupling between inputs 58 and 60 of low-noise amplifier circuit 56 and the ground, which is preferably at least one wired inductance.

The use of the previously described LNA circuit 56 in the circuit enables to benefit from its low noise properties.

Such LNA circuit 56 may be used for several different applications.

For instance, it may be proposed a circuit comprising a low-noise amplifier circuit as previously described and a power amplifier. An RF power amplifier is a type of electronic amplifier used to convert a low-power radio-frequency signal into a larger signal of significant power, typically for driving the antenna of a transmitter. It is usually optimized to have high efficiency, high output power compression, good return loss on the input and output, good gain, and optimum heat dissipation. According to this example, the low-noise amplifier circuit input is shared with the power amplifier across a Balun. In the specific case of FIG. 4, the Balun is a Balun 5020.

A Balun is a type of electrical transformer that can convert electrical signals that are balanced about ground (differential) to signals that are unbalanced (single-ended), and the reverse. They are also often used to connect lines of differing impedance. The origin of the word balun is bal(ance)+un(balance). Baluns can take many forms and their presence is not always obvious. They always use electromagnetic coupling for their operation.

Figure 5:
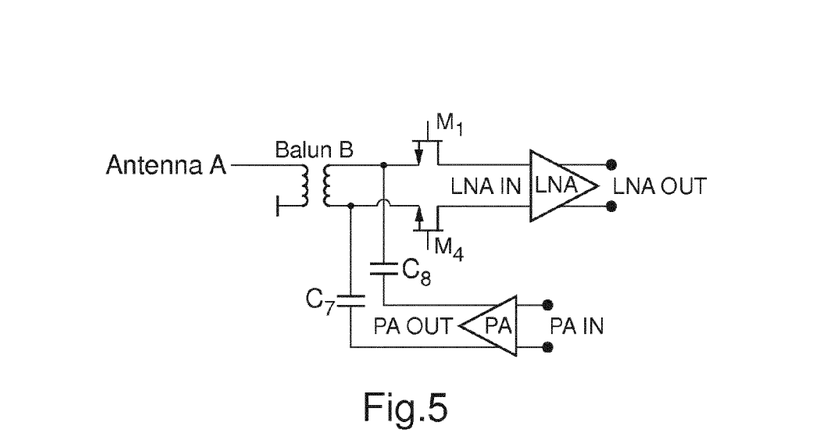
FIG. 5 shows an example of application with a Balun of LNA circuit according to an embodiment of the invention.

FIG. 5 shows an example of application with a Balun of LNA circuit according to an embodiment of the invention. The Balun is a 50/20 ohms balun. There is an Antenna A on one side of the balun B, whereas there are a common gate low noise amplifier LNA and a power amplifier PA on the other side of the balun B. Low noise amplifier LNA presents an input LNA IN and an output LNA OUT. Power amplifier PA presents an input PA IN and an output PA OUT.

Low noise amplifier input LA IN is shared with a power amplifier output PA OUT through a Balun B. The power amplifier output PA OUT is connected, through two capacitors C7 and C8, to the low noise amplifier input LA IN with two GO2 switches $M_1$ and $M_4$. Switches $M_1$ and $M_4$ prevent low noise amplifier LNA over voltage when power amplifier PA is active.

When power amplifier PA is active, the switches $M_1$ and $M_4$ are off and the low noise amplifier LNA is off. The power amplifier PA only sees the 20 ohms of the balun B secondary access and the off impedance of the low noise amplifier input LNA IN.

When Antenna A receiver is active, the switches $M_1$ and $M_4$ are on and the power amplifier PA is off. The low noise amplifier LNA only sees the 20 ohms and the off impedance of the power amplifier PA.

This application is full integrated and presents no external components for the receiver transmitter switch.

Alternatively, it may be considered a mobile device comprising a low-noise amplifier circuit 56 as previously described.

The low-noise amplifier circuit 56 may also be used to amplify at least one signal in the WLAN band.

Other applications may be considered since this LNA circuit enables the reception of WIFI or BT (BT stands for Bluetooth) either independently or simultaneously. Indeed, in terms of wireless networking communications, two of the currently dominant, standardized approaches are specified in Wireless LAN (WLAN, "Wi-Fi", 802.11 abgn) standard and the Bluetooth standard.

WLAN devices are frequently used, for example, to provide wireless Internet connectivity and operate two frequency bands, i.e., a low band disposed in the 2.4 GHz Industrial, Scientific and Medical Band (ISM band) and a high band disposed in the 5 GHz range. Bluetooth devices also operate in the 2.4 GHz and are frequently used, for example, for short range communications, e.g., between a mobile phone and an associated earplug device.

The invention has been described with reference to preferred embodiments. However, many variations are possible within the scope of the invention.

APPENDICE I

TABLE OF ACRONYMS

| ACRONYMS | MEANING |
|---|---|
| BT | Bluetooth |
| EPROM | Erasable Programmable Read-Only Memory |
| EEPROM | Electrically Erasable Programmable Read-Only Memory |
| FET | Field-Effect Transistor |
| HFET | Heterostructure FET |
| IIP3 | Third Order Input Intercept Point |
| JFET or JUGFET | Junction gate FET |
| LNA | Low-Noise Amplifier |
| MODFET | MOdulation-Doped FET |
| MOSFET | Metal-Oxide-Semiconductor FET |
| NF | Noise Figure |
| NMOS | NMOSFET = n-Channel MOSFET |
| PA | Power Amplifier |
| PMOS | PMOSFET = p-Channel MOSFET |
| RF | Radio Frequency |
| SNR | Signal-to-Noise Ratio |
| TOI | Third-Order Intercept Point |
| VSWR | Voltage Standing Wave Ratio |
| WLAN | Wireless Local Area Network |

APPENDICE II

Additional Formulas Concerning LNA Circuit

The following expressions are related to the example of FIG. 2 and can be derived by applying known physical laws to the circuit of FIG. 2. Same notation as before is used.

1) Expression of the Effective Transconductance of the First Transistor $M_1$ $$Gm_n = \frac{i_n}{V_X} = \frac{1 + 2(gm_1 + gmbs_1)rds_1}{rds_1 + \frac{1}{gm_2 + gmbs_2}} \quad \text{(Equation 8)}$$

Wherein:
$gmbs_1$; $gmbs_2$ is the backgate transconductance of transistors $M_1$ and $M_2$
$gm_1$; $gm_2$ is the transconductance of transistors $M_1$ and $M_2$
$rds_1$ is the resistance between the drain and the source terminals of the first transistor $M_1$ in small-signal approximation, 2) Expression of the Potential $V_{in}$ $$V_{in} = Vx\left(1 + Gm_n Rs_1 + \frac{Rs_1}{Rp}\right) \quad \text{(Equation 9)}$$

3) Expression of the Transconductance of the First Transistor $M_1$ $$gm_n = \frac{Gm_n}{1 + \frac{Rs_1}{Rp} + Gm_n Rs_1} \quad \text{(Equation 10)}$$

4) Expression of the equivalent input resistance $R_n$ of the first transistor $M_1$ $$R_n = R_L \mathbin{/\mkern-5mu/} Zin_n = R_L \mathbin{/\mkern-5mu/} \left(\frac{\frac{1}{gm_2 + gmbs_2} + rds_1}{1 + 2(gm_1 + gmbs_1)rds_1}\right) \quad \text{(Equation 11)}$$

Wherein:

$rds_1$ is the resistance between the drain and the source terminals of the first transistor $M_1$ in small-signal approximation, $gmbs_1$; $gmbs_2$ is the backgate transconductance of transistors $M_1$ and $M_2$, // Means that the Resistance Considered is the Equivalent Resistance of Two resistances in parallel. In other words, $R = R_X \mathbin{/\mkern-5mu/} R_Y$ means that the resistance R is equal to $$R = \frac{R_X \cdot R_Y}{R_X + R_Y}.$$

5) Expression of the Effective Transconductance of the Fifth Transistor $M_5$ $$Gm_P = \frac{i_P}{Vx} = \frac{1 + 2(gm_3 + gmbs_3)rds_3}{rds_3 + (rout_n \mathbin{/\mkern-5mu/} Rc)} \quad \text{(Equation 12)}$$

Wherein:

$Gm_p$ is the effective transconductance of the fifth transistor $M_5$,

6) Other Expression of the Potential $V_{in}$ $$V_{in} = V_x\left(1 + Gm_p Rs_1 + \frac{Rs_1}{Rn}\right) \quad \text{(Equation 13)}$$

7) Expression of the Transconductance of the Fifth Transistor $M_5$ $$gm_p = \frac{Gm_p}{1 + \frac{Rs_1}{Rn} + Gm_p Rs_1} \quad \text{(Equation 14)}$$

8) Expression of the Equivalent Output Resistance Rp of the Fifth Transistor $M_5$ $$Rp = R_L \mathbin{/\mkern-5mu/} \frac{(Rout_n \mathbin{/\mkern-5mu/} Rc) + rds_5}{1 + 2(gm_5 + gmbs_5)rds_5} \quad \text{(Equation 15)}$$

$Rout_n$ is the output resistance seen by the cascode second transistor $M_2$, $rds_5$ is the resistance between the drain and the source terminals of the fifth transistor $M_5$ in small-signal approximation.

$gmbs_5$ is the backgate transconductance of the fifth transistor $M_5$.

The invention claimed is:

1. A low-noise amplifier circuit comprising:
a first transistor NMOS, a second transistor NMOS, a third transistor NMOS and a fourth transistor NMOS, each transistor having a source terminal, a gate terminal and a drain terminal,
the source terminal of the second transistor being coupled to the drain terminal of the first transistor,
the source terminal of the third transistor being coupled to the drain terminal of the fourth transistor,
the gate terminal of the first transistor having a first capacitive coupling to the source terminal of the fourth transistor, and
the gate terminal of the fourth transistor having a second capacitive coupling to the source terminal of the first transistor;
a fifth transistor PMOS and a sixth transistor PMOS, each transistor having a source terminal, a gate terminal and a drain terminal,
the drain terminal of the fifth transistor being coupled to the drain terminal of the second transistor,
the drain terminal of the sixth transistor being coupled to the drain terminal of the third transistor,
the source terminal of the fifth transistor having a third capacitive coupling to the source terminal of the first transistor,
the gate terminal of the fifth transistor having a fourth capacitive coupling to the source terminal of the sixth transistor or to the source terminal of the fourth transistor,
the gate terminal of the sixth transistor having a fifth capacitive coupling to the source terminal of the fifth transistor or to the source terminal of the first transistor, and
the source terminal of the sixth transistor having a sixth capacitive coupling to the source terminal of the fourth transistor.

2. The low-noise amplifier circuit according to claim 1, wherein the source terminals of the first transistor and of the fourth transistor are inputs of the low noise amplifier circuit, and the drain terminals of the second transistor and the third transistor are outputs of the low-noise amplifier circuit.

3. The low-noise amplifier circuit according to claim 1,
wherein the first capacitive coupling is configured to increase an effective transconductance of the first transistor and to decrease an effective equivalent input resistance $R_n$ of the first transistor both by a factor superior or equal to two,
wherein the second capacitive coupling is configured to increase an effective transconductance of the fourth transistor and to decrease an effective equivalent input resistance of the fourth transistor both by a factor superior or equal to two,
wherein the fourth capacitive coupling is configured to increase an effective transconductance of the fifth transistor and to decrease an input resistance of the fifth transistor both by a factor superior or equal to two, and/or wherein the fifth capacitive coupling is configured to increase an effective transconductance of the sixth transistor and to decrease an input resistance of the sixth transistor both by a factor superior or equal to two.

4. The low-noise amplifier circuit according to claim 1, further comprising an inductive coupling to the ground.

5. The low-noise amplifier circuit according to claim 1, wherein gate potential of the fifth and sixth transistors is fixed by a common loop circuit via two resistances, and wherein the reference voltage of the common loop is taken between outputs of the low noise amplifier circuit.

6. The low-noise amplifier circuit according to claim 1, wherein at least one of the source terminal of the fifth or sixth transistors has a resistive coupling to a DC-Voltage, preferably with at least a wired resistor, and wherein gate potential of the first and fourth transistors is fixed by a current mirror via two resistances.

7. The low-noise amplifier circuit according to claim 1, wherein the gate terminal of the first and/or of the fourth transistor has a resistive coupling to a DC-Voltage, or has a coupling to a DC-Voltage through a MOS transistor.

8. The low-noise amplifier circuit according to claim 1, further configured to amplify at least one signal in the WLAN band or at least one signal in the Bluetooth band.

9. The low-noise amplifier circuit according to claim 8, wherein noise figure values over the WLAN band and/or Bluetooth band of the low-noise amplifier circuit are inferior to 2 dB.

10. A circuit comprising:
a low-noise amplifier circuit including
a first transistor NMOS, a second transistor NMOS, a third transistor NMOS and a fourth transistor NMOS, each transistor having a source terminal, a gate terminal and a drain terminal, the source terminal of the second transistor being coupled to the drain terminal of the first transistor, the source terminal of the third transistor being coupled to the drain terminal of the fourth transistor, the gate terminal of the first transistor having a first capacitive coupling to the source terminal of the fourth transistor, and the gate terminal of the fourth transistor having a second capacitive coupling to the source terminal of the first transistor;
a fifth transistor PMOS and a sixth transistor PMOS, each transistor having a source terminal, a gate terminal and a drain terminal, the drain terminal of the fifth transistor being coupled to the drain terminal of the second transistor, the drain terminal of the sixth transistor being coupled to the drain terminal of the third transistor, the source terminal of the fifth transistor having a third capacitive coupling to the source terminal of the first transistor, the gate terminal of the fifth transistor having a fourth capacitive coupling to the source terminal of the sixth transistor or to the source terminal of the fourth transistor, the gate terminal of the sixth transistor having a fifth capacitive coupling to the source terminal of the fifth transistor or to the source terminal of the first transistor, and the source terminal of the sixth transistor having a sixth capacitive coupling to the source terminal of the fourth transistor; and
a power amplifier,
wherein the low-noise amplifier circuit input is shared with the power amplifier across a Balun.

11. A mobile device comprising:
a low-noise amplifier circuit including
a first transistor NMOS, a second transistor NMOS, a third transistor NMOS and a fourth transistor NMOS, each transistor having a source terminal, a gate terminal and a drain terminal, the source terminal of the second transistor being coupled to the drain terminal of the first transistor, the source terminal of the third transistor being coupled to the drain terminal of the fourth transistor, the gate terminal of the first transistor having a first capacitive coupling to the source terminal of the fourth transistor, and the gate terminal of the fourth transistor having a second capacitive coupling to the source terminal of the first transistor;
a fifth transistor PMOS and a sixth transistor PMOS, each transistor having a source terminal, a gate terminal and a drain terminal, the drain terminal of the fifth transistor being coupled to the drain terminal of the second transistor, the drain terminal of the sixth transistor being coupled to the drain terminal of the third transistor, the source terminal of the fifth transistor having a third capacitive coupling to the source terminal of the first transistor, the gate terminal of the fifth transistor having a fourth capacitive coupling to the source terminal of the sixth transistor or to the source terminal of the fourth transistor, the gate terminal of the sixth transistor having a fifth capacitive coupling to the source terminal of the fifth transistor or to the source terminal of the first transistor, and the source terminal of the sixth transistor having a sixth capacitive coupling to the source terminal of the fourth transistor.

12. The low-noise amplifier circuit according to claim 4, wherein the inductive coupling includes at least a wired inductance.

13. The low-noise amplifier circuit according to claim 7, wherein the resistive coupling includes at least a wired resistor.

14. The low-noise amplifier circuit according to claim 9, wherein the noise figure values over the WLAN band and/or Bluetooth band of the low-noise amplifier circuit are inferior to 1.8 dB.

* * * * *